(12) United States Patent
Bhat et al.

(10) Patent No.: US 7,965,752 B1
(45) Date of Patent: Jun. 21, 2011

(54) NATIVE GREEN LASER SEMICONDUCTOR DEVICES

(75) Inventors: Rajaram Bhat, Painted Post, NY (US); Chad Stephen Gallinat, Santa Barbara, CA (US); Jerome Napierala, Painted Post, NY (US); Dmitry Sizov, Corning, NY (US); Chung-En Zah, Holmdel, NJ (US)

(73) Assignee: Corning Incorporated, Corning, NY (US)

(*) Notice: Subject to any disclaimer, the term of this patent is extended or adjusted under 35 U.S.C. 154(b) by 19 days.

(21) Appl. No.: 12/627,814

(22) Filed: Nov. 30, 2009

(51) Int. Cl.
*H01S 5/00* (2006.01)

(52) U.S. Cl. .................... 372/45.012; 372/44.011

(58) Field of Classification Search .......... 372/45.012; 438/28; 257/E21.499, 94
See application file for complete search history.

(56) References Cited

U.S. PATENT DOCUMENTS

| | | | | |
|---|---|---|---|---|
| 5,889,805 | A * | 3/1999 | Botez et al. | 372/45.01 |
| 7,058,105 | B2 * | 6/2006 | Lee et al. | 372/45.01 |
| 7,408,199 | B2 * | 8/2008 | Matsuyama et al. | 257/79 |
| 7,724,795 | B2 * | 5/2010 | Son et al. | 372/45.01 |
| 2005/0056853 | A1 | 3/2005 | Kimura | 257/94 |
| 2005/0232327 | A1 | 10/2005 | Nomura et al. | 372/50.12 |
| 2008/0192788 | A1 | 8/2008 | Matsuyama et al. | 372/44.011 |

FOREIGN PATENT DOCUMENTS

| | | |
|---|---|---|
| WO | 2008/100505 | 8/2008 |
| WO | 2009/021206 | 2/2009 |
| WO | 2010/077810 | 7/2010 |

OTHER PUBLICATIONS

"Compact green laser converter with injection pumping, based on MBE grown II-VI nanostructures"; Ivanov et al; Journal of Crystal Growth 311 (2009) 2120-2122.
"Recent achievements of AlInGaN based laser diodes in blue and green wavelength"; Jang et al; Invited Paper; Photonics PRJ. Team, Samsung Advanced Institute of Technology, PO Box 111, Suwon 440-600, South Korea.
"Effect of barrier thickness on the interface and optical properties of InGaN/GaN multiple quantum wells"; Kim et al; Journal of Applied Physics, vol. 40 (2001) pp. 3085-3088.
"Optical characteristics of III nitride quantum wells with different crystallographic orientations"; Kisin et al; Journal of Applied Physics 105, 013112 (2009).
"Stimulated emission at 474 nm from an InGaN laser diode structure grown on a (1122) GaN substrate"; Kojima et al; Applied Physics Letters 91, 251107 (2007).

(Continued)

*Primary Examiner* — Minsun Harvey
*Assistant Examiner* — Tuan N. Nguyen
(74) *Attorney, Agent, or Firm* — Gregory V. Bean (57) ABSTRACT

A semiconductor laser device operable to emit light having a desired wavelength in the green spectral range. The semiconductor laser device may include a pumping source and a laser structure including a substrate, a first cladding layer, and one or more active region layers. The one or more active region layers include a number of quantum wells having a spontaneous emission peak wavelength that is greater than about 520 nm at a reference pumping power density. The pumping source is configured to pump each quantum well at a pumping power density such that a stimulated emission peak of each quantum well is within the green spectral range, and the number of quantum wells within the one or more active region layers is such that a net optical gain of the quantum wells is greater than a net optical loss coefficient at the desired wavelength in the green spectral range.

23 Claims, 6 Drawing Sheets

OTHER PUBLICATIONS

"Gain suppression phenomena observed in $In_xGa_{1-x}N$ quantum well laser diodes emitting at 470 nm"; Kojima et al; Applied Physics Letters 89, 241127 (2006).

"Behaviors of emission wavelength shift in AlInGaN-based green laser diodes"; Lee et al; IEEE Electronic Device Letters, vol. 29, No. 9, Aug. 2008; pp. 870-872.

"Barrier width dependence of group-III nitrides quantum-well transition energies"; Leroux et al; Physical Review B; vol. 60 No. 3; Jul. 15, 1999.

"Optically pumped InGaN/GaN MQW lift-off lasers grown on silicon substrates"; Lutsenko et al; Science Direct; Superlattices and Microstructures 41 (2007) 400-406.

"510-515 nm InGaN-based green laser diodes on c-Plane GaN substrate"; Miyoshi et al; Applied Physics Express 2 (2009) 062201.

"Wavelength dependence of InGaN laser diode characteristics"; Nagahama et al; Journal of Applied Physics, vol. 40 (2001) pp. 3075-3081.

"Characteristics of InGaN multi-quantum-well-structure laser diodes"; Nakamura et al; 1996 American Institute of Physics [S0003-6951(96)02823-9].

"Nonpolar m-plane InGaN multiple quantum well laser diodes with a lasing wavelength of 499.8 nm"; Okamoto et al; Applied Physics Letters 94, 071105 (2009).

"500 nm electrically driven InGaN based laser diodes"; Queren et al; Applied Physics Letters 94; 081119 (2009).

"Superluminescence in green emission GaInN/GaN quantum well structures under pulsed laser excitation"; Senawiratne et al; Material Research Soc. Symp. Proc. vol. 1040 2008 Materials Research Society; 1040-Q05-05.

"MOCVD growth, stimulated emission and time-resolved PL studies of InGaN/(In)GaN MQWs: well and barrier thickness dependence"; Shee et al; Journal of Crystal Growth 221 (2000) 373-377.

"Lasing and optical gain around 500 nm from optically pumped lasers grown on c-plane GaN substrates"; Optics Letters, vol. 34, No. 3, Feb. 1, 2009.

"Measurement of optical loss variation on thickness of InGaN optical confinement layers of blue-violet-emitting laser diodes"; Son et al; Journal of Applied Physics 103, 103101 (2008).

"Stimulated emission at blue-green (480 nm) and green (514 nm) wavelengths from nonpolar (m-plane) and semipolar (1122) InGaN multiple quantum well laser diode structures"; Tyagi et al; Applied Physics Express 1 (2008) 091103.

"Recent progress in high power blue violet lasers"; Uchida et al; MA3 (Invited paper); Development Center, Sony Shiroishi Semiconductor Inc; Japan.

"Polarization switching phenomena in semipolar $In_xGa_{1-x}N/GaN$ quantum well active layers"; Physical Review B 78, 233303 (2008).

"Blue InGaN/GaN multiple-quantum-well optically pumped lasers with emission wavelength in the spectral range of 450-470 nm"; Yablonskii et al; Applied Physics Letters; vol. 79 No. 13; Sep. 24, 2001.

Anisotropic optical matrix elements in strained GaN quantum wells on semipolar and nonpolar substrates; Yamaguchi; Japanese Journal of Applied Physics; vol. 46; No. 33, 2007; L789-L791.

"Theoretical investigation on polarization control of semipolar oriented InGaN quantum well emission using (Al)InGaN alloy substrates"; Yamaguchi; Applied Physics Letters 94, 201104, (2009).

Continuous wave operation of 520 nm green InGaN based laser diodes on semi-polar (2021) GaN substrates; Yoshizumi et al; Applied Physics Express 2 (2009) 092101.

* cited by examiner

NATIVE GREEN LASER SEMICONDUCTOR DEVICES

BACKGROUND

1. Field of the Disclosure

The present disclosure relates to native green laser semiconductor devices and, more particularly, to Group-III nitride native green laser semiconductor devices having an increased number of quantum wells.

2. Technical Background of the Disclosure

Group-III nitride lasers convert externally supplied energy (from electrical current or pumping light) directly into lasing radiation at a desired wavelength that is generated inside its active region due to the radiative recombination of charge carriers in semiconductor valence and conduction bands. High power native green lasers that are both reliable and have high wall plug efficiency are in demand for many applications, including laser projection system, for example. However, current semiconductor laser devices are not suitable in such applications because they do not provide high power, reliable and efficient lasing in the true green spectral range.

BRIEF SUMMARY

The present inventors have recognized that Group III nitride materials are promising for fabricating native green laser semiconductor devices that may be optically or electrically pumped to produce output radiation in the green spectral range. A Group III-nitride laser may generally comprise a laser structure having an InGaN quantum well active region layer, (the quantum well being the source of the radiative recombination), GaN or InGaN waveguide layers positioned proximate one or more cladding layers to confine light around the active region layer, reflective facet mirrors to provide optical feedback and, in case of electrically pumped semiconductor lasers, a p-n junction contacted by metal electrodes to obtain electrical injection of the charge carriers to generate the radiative recombination necessary to emit radiation.

In one embodiment, a semiconductor laser device operable to emit light having a desired wavelength in the green spectral range includes a pumping source and a laser structure having a substrate, a first cladding layer, and one or more active region layers. The first cladding layer is positioned on the substrate, and the one or more active region layers are positioned above the first cladding layer. The one or more active region layers include a number of quantum wells having a spontaneous emission peak wavelength that is greater than about 520 nm at a reference pumping power density. The laser structure has a net optical loss coefficient of light propagating in a waveguide mode within the laser structure. The pumping source is configured to pump each quantum well at a pumping power density such that a stimulated emission peak of each quantum well is within the green spectral range. The number of quantum wells within the one or more active region layers are such that a net optical gain of the quantum wells is greater than the net optical loss coefficient of the semiconductor laser device at the desired wavelength in the green spectral range.

In another embodiment, a semiconductor laser device operable to emit light having a desired wavelength in the green spectral range includes an optical pumping source and a laser structure having a substrate, a first cladding layer, one or more active region layers, and at least two waveguide layers. The first cladding layer is positioned on the substrate, and the one or more active region layers and the at least two waveguide layers are positioned on the first cladding layer such that the one or more active region layers are positioned between the two waveguide layers. The laser structure has a net optical loss coefficient of light propagating in a waveguide mode defined by the active region, waveguide and cladding layers and further includes a cleaved facet having a high reflectivity coating along the {1-100} crystallographic plane and a pumping stripe along the [1-100] direction. The one or more active region layers include three or more quantum wells such that a net optical gain of the quantum wells is greater than the net optical loss coefficient of the semiconductor laser device at the desired wavelength in the green spectral range. The optical pumping source is operable to emit optical radiation into the pumping stripe to optically pump each quantum well at a pumping power density such that a stimulated emission of each quantum well is within the green spectral range.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Generally, embodiments described herein provide for high power and efficient native green laser semiconductor devices by maximizing the efficiency of the laser structure, maximizing the optical gain such that it overcomes a total optical loss of the laser structure at a reasonable pumping power, minimizing the internal optical loss while keeping high external quantum efficiency, and optimizing facet reflectivity to achieve high output power. Native green laser lasing may be achieved by reducing the optical loss within the laser structure and increasing the number of quantum wells to overcome the optical and output losses.

Figure 1:
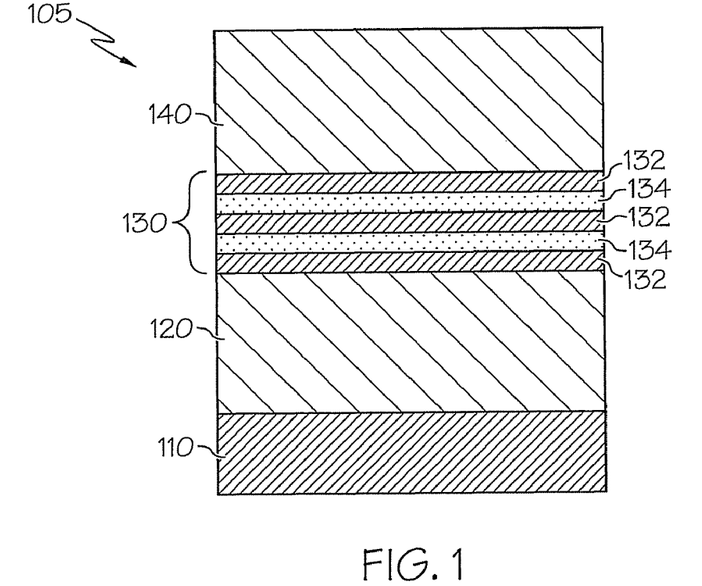
FIG. 1 is a cross sectional schematic illustration of an exemplary laser structure according to one or more embodiments illustrated and described herein.
Figure 6:
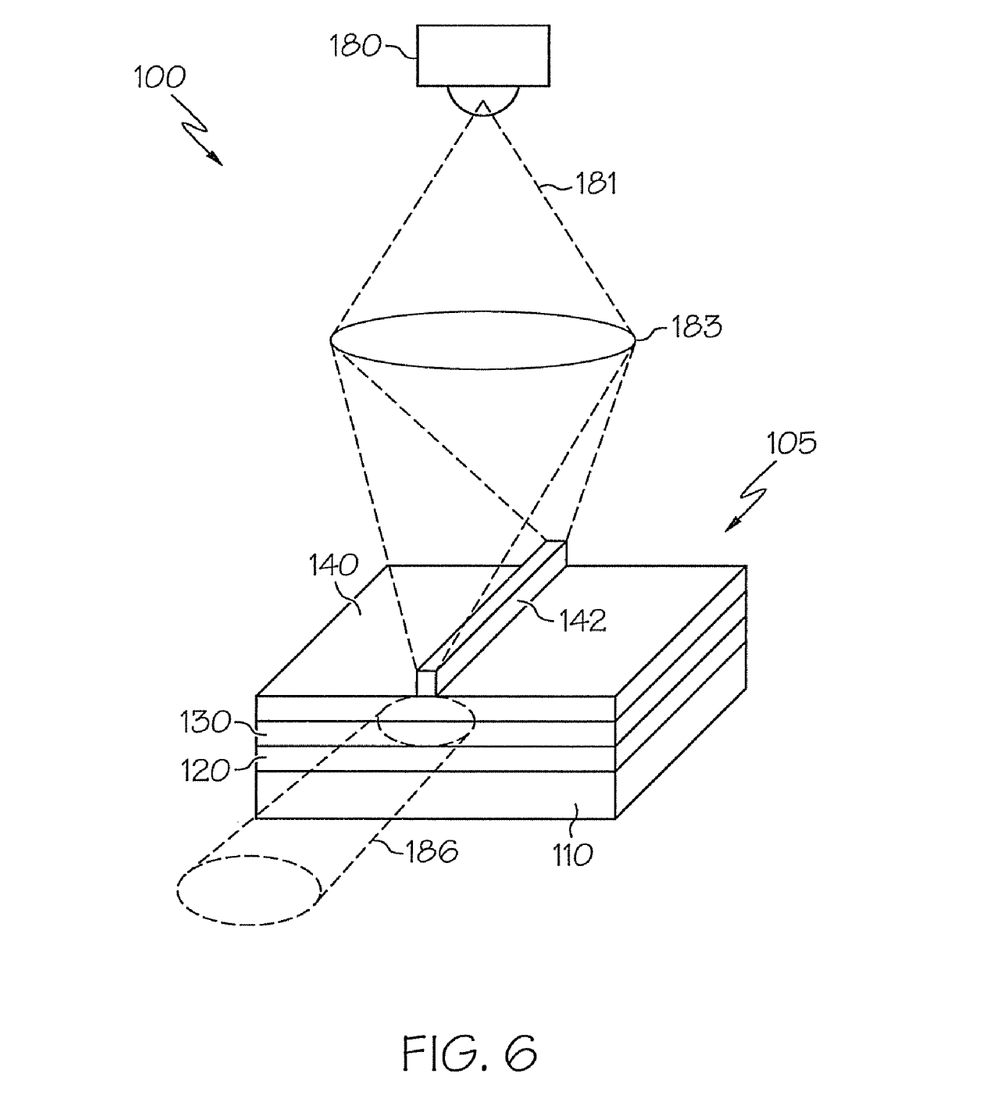
FIG. 6 is a schematic illustration of an exemplary optically pumped laser structure that is pumped in a first pumping orientation according to one or more embodiments illustrated and described herein.
Figure 7:
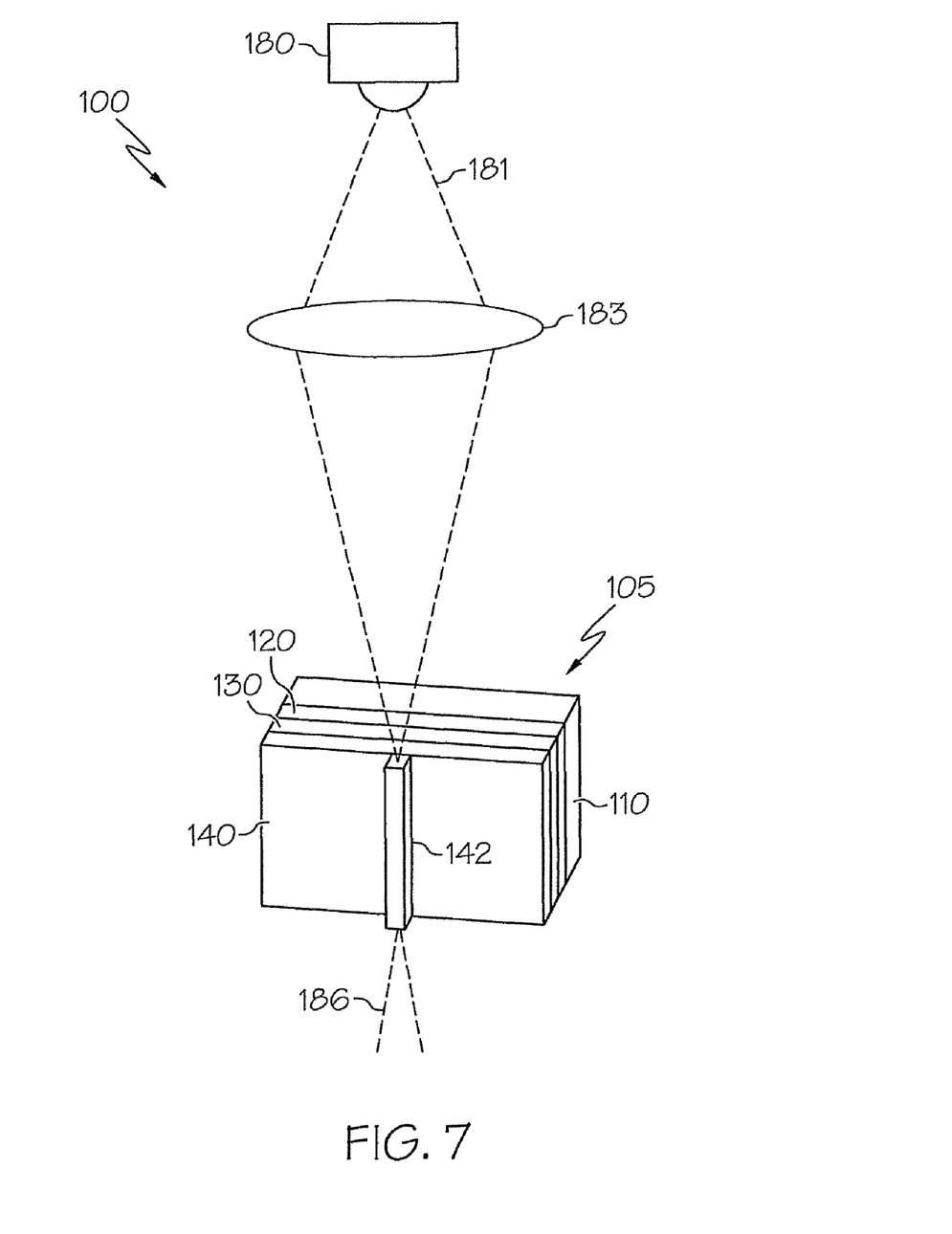
FIG. 7 is a schematic illustration of an exemplary optically pumped laser structure that is pumped in a second pumping orientation according to one or more embodiments illustrated and described herein.

Referring initially to FIGS. 1 and 6, a native green semiconductor laser device 100 and a laser structure 105 according to one embodiment of the present disclosure are illustrated. FIG. 6 illustrates an optically pumped semiconductor laser device 100 comprising an optical pumping source 180, coupling optics 184 and a laser structure 105. As described in more detail below, the laser structure 105 is operable to be pumped either optically as illustrated in FIGS. 6 and 7 or electrically with a p-n junction to emit an output beam in the green spectral range. More specifically, embodiments are related to native green semiconductors lasers based on group III-nitride compounds. Embodiments are referred to as native green lasers in contrast to other laser device configurations that generate light at an initial wavelength which is then converted to the green light via nonlinear optical effects (e.g., using second harmonic generation).

Referring specifically to FIG. 1, a general schematic of an exemplary laser structure 105 illustrates a front cross sectional view. The laser structure 105 may comprise one or more waveguide layers 132 positioned such that one or more active region layers 134 are between them. The active region layers 134 and waveguide layers 132 define an inner layer 130. The active region layer 134 provides light amplification in a lasing operation which may be characterized by an optical gain value. The waveguide layer 132 may be positioned between top and bottom cladding layers 120, 140 which have a refractive index that is lower than the average refractive index of the active region layer 134 or the refractive index of the waveguide layer 132. Although the active region layer and waveguide layers 134, 132 may be described as being positioned above a bottom cladding layer 120, it should be understood that these layers may be positioned below such a cladding layer 120 in a laser structure having an orientation inverse to the orientation depicted in FIG. 1 (i.e., the substrate is positioned on top of the laser structure). The refractive indices of the cladding layers 120, 140 and the active region layer 134 may be designed to achieve optical confinement (i.e., vertical optical confinement), which enables light amplification by the active region layer 134. In another embodiment, the laser structure 105 may not comprise a top cladding layer 140. As described in more detail below, a laser structure may comprise one or more transparent layers (e.g., dielectric layers) with or without a top cladding layer 140. Further, in other embodiments the laser structure 105 may not comprise waveguide layers. In such embodiments, the optical confinement is only within the active region layer or layers 134 and the cladding layer or layers 120, 140.

Figure 5:
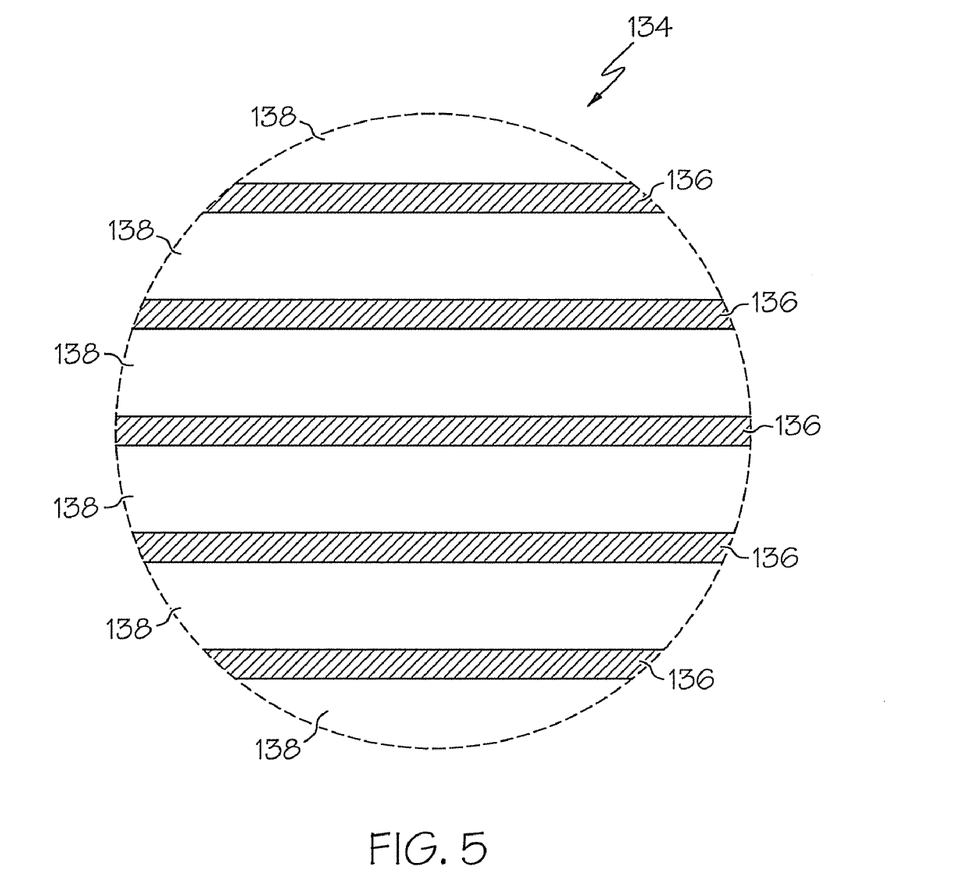
FIG. 5 is a schematic illustration of an active region layer of an exemplary laser structure according to one or more embodiments illustrated and described herein.

The active region layer 134 may be made of a single InGaN quantum well or InGaN/InGaN or InGaN/GaN multiple quantum well layers separated by quantum well barriers. FIG. 5 depicts a schematic of an exemplary active region layer 134 having a plurality of quantum well layers 136 separated by a plurality of quantum well bather layers 138 made of InGaN, GaN, or any combinations thereof. The waveguide layer 132 may be made of GaN or InGaN layers with lower concentration of In than in the quantum wells of the active region layer 134, while the cladding layer or layers 120, 140 may be made of GaN, AlGaN, AlInGaN, or any combinations thereof.

Figure 2:
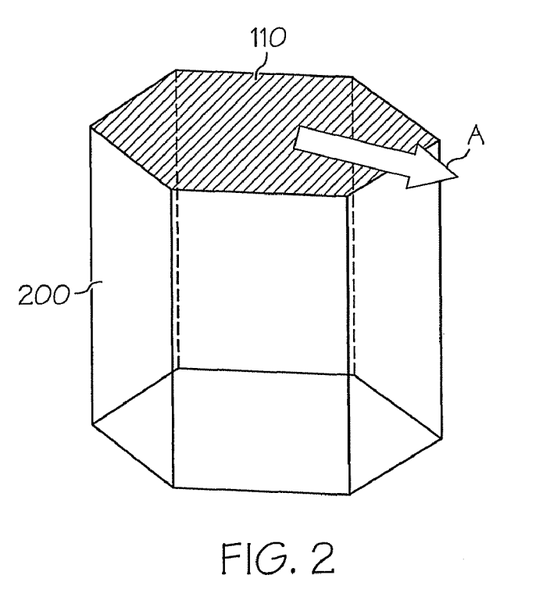
FIG. 2 is a schematic illustration of a substrate crystal plane orientation {0001} for the growth of an exemplary laser structure according to one or more embodiments illustrated and described herein.
Figure 3:
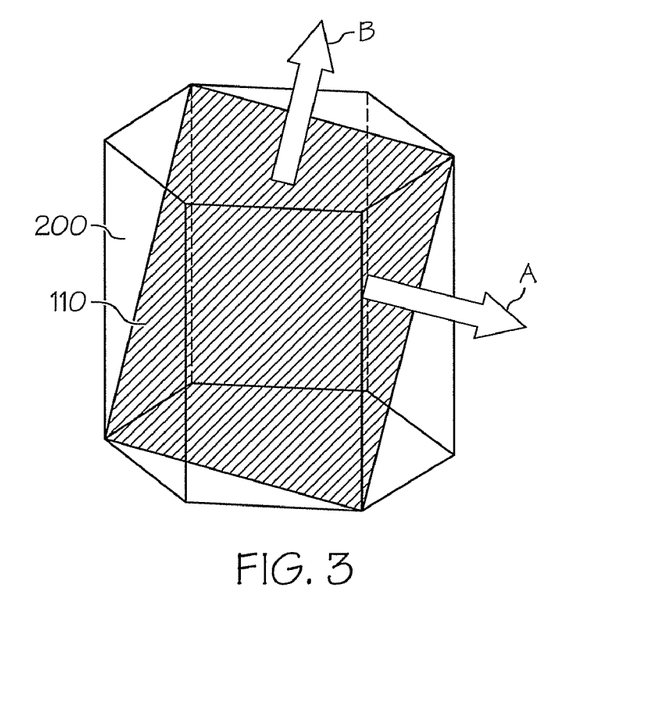
FIG. 3 is a schematic illustration of a substrate crystal plane orientation {11-22} according to one or more embodiments illustrated and described herein.

The above-mentioned layers may be grown on a GaN substrate with wurtzite crystal symmetry and surface plane orientations, such as $\{0001\}$, $\{11\text{-}22\}$ and $\{20\text{-}21\}$ for example. The present inventors have found c-plane $\{0001\}$ and semipolar substrate orientations (e.g., $\{11\text{-}22\}$ and $\{20\text{-}21\}$) to be suitable for achieve lasing in the green spectral range. It should be understood that the crystallographic orientations described herein contemplate substrate orientations having a miscut wherein the substrate orientation is misoriented from the nominal orientation by a small degree, such as a few angular degrees, for example. FIG. 2 illustrates a substrate 110 cut along the [1-100] direction as indicated by arrow A to provide a $\{0001\}$ plane or c-plane substrate 110 in which the remaining layers of the laser structure 105 may be grown. FIG. 3 illustrates a $\{11\text{-}22\}$ plane substrate 110 orientation on which the layers of the laser structure 105 may be grown with subsequent formation of stripe with direction along the [1-100] direction as indicated by arrow A and the [−1-123] direction as indicated by arrow B.

Figure 4:
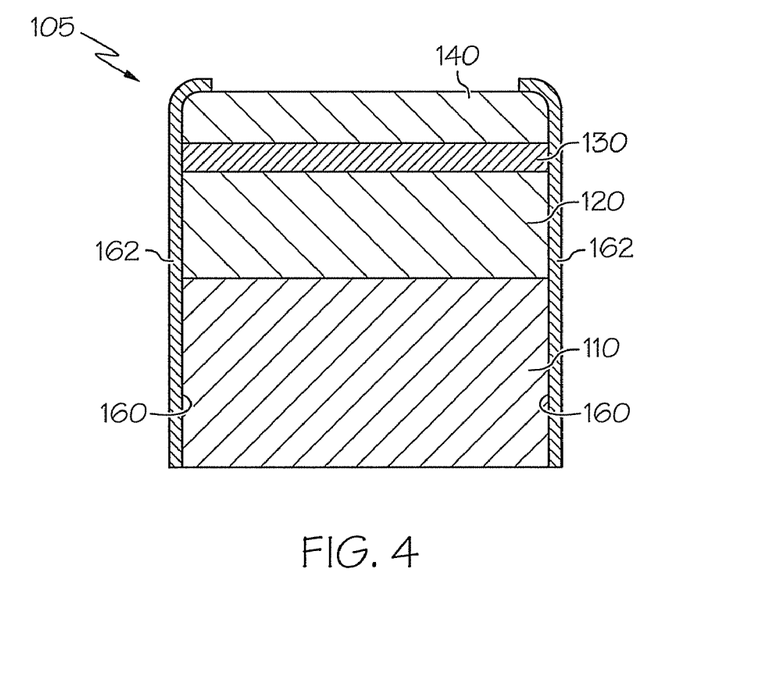
FIG. 4 is a schematic illustration of a side view of an exemplary laser structure according to one or more embodiments illustrated and described herein.

Referring now to FIG. 4, aside cross sectional view of a laser structure is illustrated. As illustrated in FIG. 4, the laser structure should have mirror facet 160 to provide optical feedback. For both GaN substrate orientations described herein, the laser structure may have mirror facets obtained by cleaving along the $\{1\text{-}100\}$ crystallographic plane, or by other facet fabrication methods such as dry and wet etching procedures. Obtaining mirror facets by cleaving may provide an atomically-smooth facet surface that can be obtained relatively easily. As described in more detail below, the facets may be coated with high reflectivity coatings 162 to reduce output loss within the laser structure 105.

The laser may also be fabricated to have a pumping stripe 142 pumped either electrically by current injection through a p-n junction (in this case the active region is located near or at the p-n junction) or optically by using an external light source. The light within the active region layers 134 and waveguide layers 132 should also be laterally confined within the pumping stripe 142 to insure high efficiency of light amplification. For this purpose, various methods of gain guiding or index guiding mechanisms as known in the art may be utilized. As illustrated in FIGS. 6 and 7, the pumping stripe 142 may be configured as a ridge formed on the top cladding layer 114. In embodiments not having a top cladding layer 114, the pumping stripe may be defined by a ridge on an oxide layer deposited on a waveguide layer 132 or active region layer 134. The laser pumping stripe should be normal to the facet plane, i.e., it should be oriented along [1-100] crystallographic direction in a laser structure cleaved along the $\{1\text{-}100\}$ crystallographic plane such that the light amplification within the active region layer 134 overcomes optical loss due to absorption in the material of the laser structure and the light is outputted through the facets.

The present inventors have recognized that lasing in the green spectral range may be achieved via sufficient optical net gain provided by an increased number of InGaN quantum wells in one or more active region layers. These quantum wells may have a spontaneous emission peak wavelength greater than 520 nm at a reference pumping power density (e.g., 1 kW/cm$^2$). The layers of the laser crystal heterostructure may comprise GaN, AlGaN, InGaN and/or AlInGaN layers. In the case of a smaller number of quantum wells, the total optical gain is lower. To achieve the desired gain value to overcome a net optical loss coefficient (i.e., a total optical and output loss value) of the laser structure 105, a stronger pumping of each quantum well is typically needed. However, the total pumping power may not increase significantly, because if the pumping power per quantum well is increased, the gain peak wavelength shifts to the short wavelength side thereby moving the laser emission wavelength out of the green spectral range and into the blue spectral range. One method of keeping the gain (and therefore the lasing) wavelength at longer wavelengths is to increase the In concentration in the quantum wells. However, it may be complicated to increase the In concentration because such an increase of In also increases strain in the quantum well, makes the quantum well unstable, and generates local low quality areas in quantum wells.

To increase the available optical gain without increasing the In concentration in the quantum wells, the present inventors have found that the total optical confinement factor of the laser structure active region layer may be increased by increasing the number of quantum wells. Because the optical gain per quantum well in the green spectral range is limited, an increased number of quantum wells in the active region layer may be used such that a higher net gain at the desired wavelength is achieved. The optical gain of each quantum well may be combined to generate an increased net optical gain that is sufficient to overcome the net optical loss coefficient of the laser structure. Therefore, laser structures having an increased number of quantum wells may also be utilized to fabricate semiconductor green lasers on c-plane or semipolar substrates. It is noted that increasing the number of quantum wells also aids narrowing the optical mode to some extent because the quantum wells have high refractive index resulting in better average refractive index contrast between the waveguide and cladding layers. The number of quantum wells may depend on the type of material used to create the laser structure as well as the design parameters discussed below. The number of quantum wells should be chosen such that a net optical gain provided by each of the quantum wells is greater than the net optical loss coefficient so that lasing in the green spectral range occurs. Generally, the number of quantum wells should be greater than two quantum wells.

Increasing the number of quantum wells in other applications such as blue and violet laser diodes, for example, may present disadvantages because of the higher pumping power required to reach the quantum well transparency in a laser structure having an increased number of quantum wells. In addition, increased number of quantum wells may also be associated with injected carrier transport issues described below. However, laser structures having an increased number of quantum wells described herein have properly designed parameters that overcome the above disadvantages to achieve lasing in the green spectral range with low pumping power densities.

As described above and illustrated in FIG. 6, laser structures disclosed herein may also be fabricated to have a pumping stripe 142 pumped by charge carriers such that light propagates along the pumping stripe 142 and between the facet mirrors 160. The pumping stripe direction thus should be perpendicular (normal) to the facet 160 plane. In addition to electrical injection via p-n-junction located proximate the active region layer 134 (i.e., electrical pumping), optical pumping may also be used to pump the laser structure, wherein optical energy provided by an optical pumping source 180 is utilized to pump the laser structure.

To achieve lasing wherein the gain value of the semiconductor laser device overcomes the net optical loss coefficient, the active region layer 134 design and the crystallographic orientation of the laser structure 105 should be properly chosen. Proper design and crystal orientation should simultaneously meet both requirements of low net optical loss coefficient and high optical gain, which may be contradictory requirements. Further, sufficient optical gain should be achieved at a low enough pumping power to provide green lasing wavelengths in consumer electronic devices such as a laser projector device, for example.

For a semiconductor laser device to operate in a lasing condition, the optical gain has to overcome the optical loss coefficient within the laser cavity. The present inventors have found that the optical gain in the green spectral range is very limited at reasonable pumping power, and that low optical gain is available from InGaN quantum wells at wavelengths greater than 500 nm. A reduction of optical loss and an increased number of quantum wells to overcome said optical loss may be utilized to extend the emission wavelength toward green spectral range in a native green semiconductor laser device having high output power and high wall plug efficiency.

As will be appreciated by those familiar with laser design and fabrication, optical loss may be decreased by optimizing the material composition and thickness of the various layers described above. For example, the internal optical absorption may be controlled by controlling the material quality and composition of the active region layer 134. In addition, optical loss may be reduced by choosing a material having a low optical absorption coefficient for the waveguide layer 132 cladding layer 120, and/or cladding layer 140, if any.

Additionally, the p-doping of material of electrically pumped semiconductor laser devices may be a source of strong internal optical loss. High p-doping, however, may be required near the active region layer 134 to achieve good electrical injection efficiency in electrically pumped semiconductor laser devices. Although decreasing p-doping near the active region layer 134 reduces internal optical loss, decreasing p-doping also leads to weakening of electrical injection properties, thereby reducing the quantum efficiency in the quantum wells. However, embodiments described herein reduce optical loss by reducing p-doping to achieve lasing in green spectral range. To maximize the reduction of optical loss caused by doping, an undoped laser structure that is pumped optically by an external light source may be used as described herein below.

Further, when the refractive index contrast between the waveguide layers 132 and cladding layer or layers 120, 140 is not high enough, light leakage due to light decoupling from waveguide layer 132 may cause additional optical loss. Heterostructure surface morphological imperfectness may also be a source of optical loss due to scattering. Optical loss can therefore be reduced by avoiding light leakage and scattering. The light leakage and scattering can be minimized by providing a strong refractive index contrast between the waveguide layers 132 and the cladding layer or layers 120, 140 while also providing a smooth surface morphology.

To manage output loss, smooth cavity facets may be obtained by cleaving, or by any other conventional or yet to be developed facet preparation techniques that yield smooth facet topology. In the context of cleaving, it is noted that the crystal orientations of cleavage planes are often limited. In addition, for a laser structure grown on a GaN wurtzite substrate as well as semipolar crystal orientations, the {1-100} plane is the more favorable plane for cleaving in particular application. Smooth cavity facets may also be obtained by an etching process, such as dry etching or wet etching. Cleaved facets may provide for greater reflectivity control and therefore better output loss control than etched facets. Therefore, facets obtained by cleaving may be desirable where the pumping stripe orientation and crystallographic orientation of the laser structure yield a low differential gain. Etched facets, or facets prepared by other techniques, may be used in laser structure configurations providing a high differential gain.

The use of high reflectivity coatings 162 may also be applied to the facets 160 of the laser structure to reduce the output loss. High reflectivity coatings reduce the ratio between the light output and internal optical loss, which also lowers the laser slope efficiency. It should also be noted that if the facet reflectivity is too high, laser output power and wall plug efficiency may be reduced. Despite these disadvantages, the use of high reflectivity coatings 162 on mirror facets 160 of laser structures 105 having increased numbers of quantum wells according to the present disclosure enable the reduction of output loss such that the net optical gain provided by the quantum wells may overcome the net optical loss coefficient.

Laser structures grown on a c-plane {0001} substrate orientation will now be describe (see FIG. 2). For c-plane substrate orientations, there is no anisotropy in-plane. However, to achieve enough net optical gain for operation in the green spectral range with higher emission power and lower threshold pumping power, the number of quantum wells in the active region should be increased and the optical loss coefficient should be minimized. Because there is no in-plane polarization anisotropy, the optical gain is equal for any pumping stripe orientation. As described above, a preferable cleaving plane is {1-100} and therefore the pumping stripe should be oriented along the [1-100] direction, which is normal to the cleaving plane.

As an example and not a limitation, a semiconductor laser device of one embodiment comprises a laser structure having a c-plane {0001} substrate orientation with a smooth cleaved facet on in the {1-100} plane and a pumping stripe in the [1-100] direction. The active region layers provide for a total of ten quantum wells. The exemplary semiconductor laser device achieves lasing wavelengths up to 520 nm via the increased number of quantum wells and low output and optical losses. The semiconductor laser device achieved a lasing wavelength of 520 nm with a pumping density of about 10 kW/cm$^2$ per quantum well. The internal optical losses were reduced by use of an undoped laser structure 105, high optical confinement provided by the ten quantum wells, a relatively high refractive index in the active region layer 134, and a smooth growth morphology by molecular beam epitaxy crystal growth techniques. Additionally, the output losses were also kept low by the use of smooth cleaved facets and high reflectivity coatings as described above. To achieve a lasing wavelength of 520 nm, the laser structure 105 was optically pumped.

The design parameters such as increased number of quantum wells, smooth facets, high reflectivity coatings, etc. described above also apply for laser structures 105 grown on semipolar substrates (see FIG. 3). However, unlike laser structures grown on c-plane substrates, achieving lasing in the green spectral range may be more complicated for laser structures having a semipolar substrate orientation because there is no in-plane crystal symmetry. To fabricate a semiconductor laser device on a semipolar substrate having high gain and low optical loss, crystal plane and pumping stripe orientation should also be considered in addition to the design parameters described above.

For semiconductor laser devices having a semipolar substrate orientation, available optical gain may depend on both pumping power and pumping stripe orientation due to complex emission polarization anisotropy behavior. As described in detail below, the present inventors have recognized that for multiple quantum well structures grown on a {11-22} GaN substrate orientation, the pumping stripe orientation along the [1-100] crystallographic direction is optimal only when the lasing threshold occurs at a relatively low pumping power density/optical gain regime, which may be realized when both internal and output optical losses are minimized as described above. A pumping stripe orientation along the [1-100] crystallographic direction is desirable because, as the pumping stripe direction should be perpendicular to the cleaved facet plane, it enables a cleaved facet in the {1-100} plane which provides for high smoothness. In this gain regime the longest emission wavelength and the lowest threshold pumping power is achieved. Using semipolar substrates and a pumping stripe orientation along [1-100] for lasers with low optical loss allow for significant reduction of threshold pumping power and may achieve the longest lasing wavelength.

Figure 8:
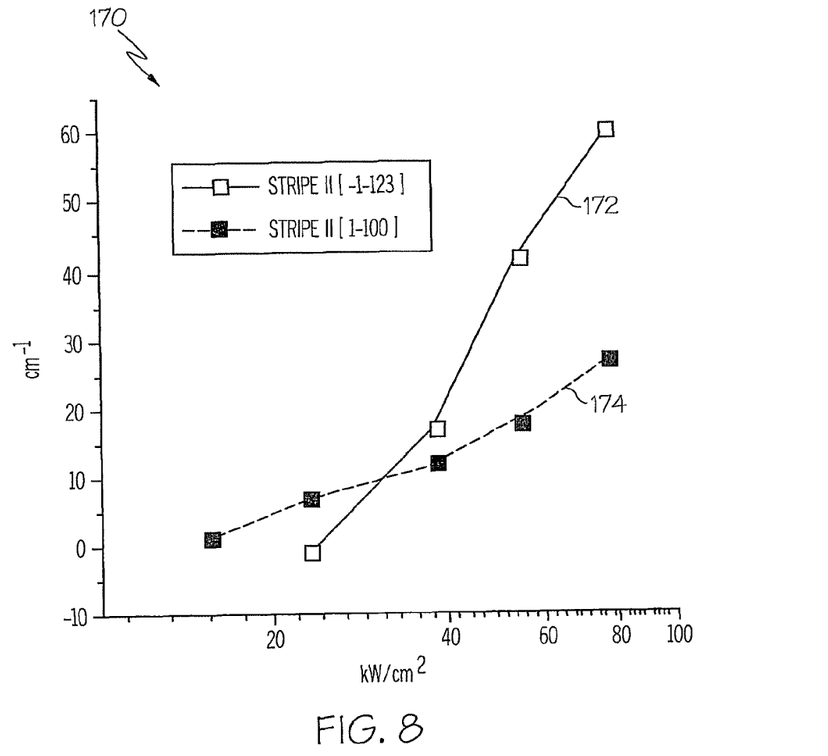
FIG. 8 is an exemplary graph plotting net optical gain versus applied pumping power for a laser structure grown on a {11-22} semipolar substrate for two pumping stripe orientations according to one or more embodiments illustrated and described herein.

The polarization of the light emission depends on the quantum well compressive strain or quantum confinement effect. The quantum wells with low In concentration have low strain and low quantum confinement effects and so has predominant electric field component E‖[1-100] which means that the pumping stripe orientation in direction [-1-123] is generally preferable. However, this pumping stripe orientation is not suitable for cleaved facets (facets cleaved in the {1-100} plane are relatively easy to produce) and so it makes it difficult to fabricate smooth laser facets and to control output optical loss such that the net gain of the increased number of quantum wells overcomes the optical loss coefficient. On the other hand, at higher In concentrations both strain and quantum confinement effects are higher thus the polarization of spontaneous emission at low pumping power switches to predominant E‖[-1-123]. However, it may be shown that at high pumping power the E‖[1-100] still dominates. For example, once the pumping power density overcomes about 30 kW/cm$^2$, the emission intensity component E‖[1-100] becomes as high as or even higher than that E‖[-1-123]. Gain measurements also demonstrate that at high pumping power, the optical gain with the pumping stripe along the [-1-123] direction is higher. Because laser operation typically occurs at high pumping power, this again suggests that the pumping stripe orientation along [-1-123] is preferable. In addition, the differential gain is higher in [-1-123] direction. However, the present inventors have recognized a relatively narrow range (less than about 30 kW/cm$^2$ for a laser structure with five quantum wells in the active region as illustrated in FIG. 8) when the gain is higher for pumping stripe oriented in [1-100] direction. This range corresponds to relatively low pumping power when quantum well material gain for a pumping stripe oriented along the [1-100] direction is greater than zero and greater than material gain for a pumping stripe oriented in the [-1-123] direction. This range however corresponds to very low quantum well material optical gain. Therefore, although a pumping stripe in the [1-100] may yield a low differential gain for most typical applications, it may be preferred for the embodiments described herein because of the relatively low pumping power densities used to reach lasing threshold in the green spectral range.

Figure 9:
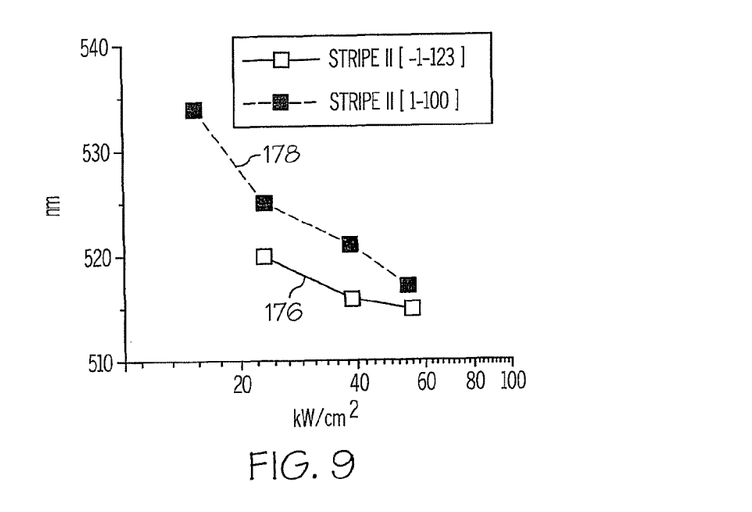
FIG. 9 is an exemplary graph plotting optical peak gain position versus applied pumping power for a laser structure grown on a {11-22} semipolar substrate for two pumping stripe orientations according to one or more embodiments illustrated and described herein.

FIG. 8 illustrates the net optical gain in cm$^{-1}$ versus absorbed pumping power in kW/cm$^2$ for a semiconductor laser device having a pumping stripe in the [-1-123] direction 172 (i.e., toward the c-plane) and a semiconductor laser device having a pumping stripe in the [1-100] direction 174 (i.e., along the m-direction). Additionally, both semiconductor lasers devices illustrated in FIG. 8 have a {11-22} semipolar orientation, five quantum wells, and a reduced optical loss (about 3 cm$^{-1}$ or less) by utilizing the techniques described above. As depicted in FIG. 8, the gain at low pumping power is higher for pumping stripe in the [1-100] direction only at a pumping power density below a certain value (for this case it is approximately 6 kW/cm$^2$ per quantum well). This is advantageous in the green laser application because, as described above, higher pumping power densities cause the gain wavelength to shorten. However, in this pumping power range even for this structure with five quantum wells the net gain does not exceed 10 cm$^{-1}$. In laser structures having even fewer quantum wells the net gain will be even less. Therefore, to operate within this low pumping power range in a green laser application, the output/optical loss should be minimized and/or modal gain should be maximized. FIG. 9 illustrates the gain peak position versus pumping power of the semiconductor laser devices illustrated in FIG. 8 (plot lines 176 and 178). As shown in FIG. 9, the gain peak wavelength is longer along the [−1-123] direction.

The output loss may be controlled and minimized by utilizing smooth, cleaved facets having high reflectivity coatings applied thereto. As an example and not a limitation, a laser structure having three quantum wells in the active region layer, a 2 mm pumping stripe in the m-direction, a cleaved facet, and an internal optical loss of approximately 3 cm$^{-1}$ achieved a lasing wavelength up to 517 nm. The threshold pumping power density was also reduced to less than about 6 kW/cm$^2$ per quantum well. The net optical gain may also be maximized by increasing the number of quantum wells. Even without high reflectivity coatings, the threshold pumping power density can be reduced down to approximately 5 kW/cm$^2$ per quantum well and the lasing wavelength can be extended to about 530 nm by increasing the number of quantum wells to five.

In the embodiment illustrated in FIG. 8 with the pumping stripe oriented along the [1-100] direction, a lasing wavelength of about 530 nm was achieved using cleaved facets with a threshold pumping power of about 25 kW/cm$^2$ without high reflective coatings. However, it is noted that using high reflectivity coatings may allow for a reduction of pumping stripe length while maintaining similar output losses. The comparison of lasing wavelength with the true spontaneous emission and optical gain measured at approximately the same pumping power indicate that for this laser design the pumping stripe orientation along the [1-100] direction is the most optimum to maximize optical gain.

As stated above, the laser structures 105 described herein may be optically or electrically pumped. Referring once again to FIG. 6, the semiconductor laser device 100 comprises an optical source 180, coupling optics 184 and a GaN-based laser structure 105 having a pumping stripe 142 formed as a ridge on a top cladding layer 114 or a transparent layer (e.g., a dielectric layer), if any. The optical source 180 may comprise a semiconductor laser capable of optically pumping the laser structure 105 with a pumping beam 181 having a wavelength that is smaller than the lasing wavelength of the laser structure 105. As an example and not a limitation, the wavelength of the pumping semiconductor laser may be between about 400 nm and about 460 nm. Use of a semiconductor pumping laser as the optical source 180 may allow for the fabrication of compact laser devices capable of producing output emission in the green spectral range, such as compact laser projectors, for example.

The coupling optics 184 may consist of a lens (e.g., a cylindrical lens or lens assembly) that focuses and directs the pumping beam 181 across the pumping stripe 142 where the light of the pumping beam 181 is confined within the pumping stripe 142 to optically pump the laser structure 105. An output beam 186 having a wavelength in the green spectral range is then emitted from the laser structure 105 in the same direction as the pumping stripe 142. In another embodiment illustrated in FIG. 7, the orientation of the crystal structure 105 with respect to the pumping beam 181 may be such that the output beam 181 enters the pumping stripe 142 from a facet-side rather than from the top of the top cladding layer 140. In this embodiment, the coupling optics 184 may comprise a lens or assembly of lenses capable of focusing the pumping beam 181 onto an edge face of the pumping stripe 142. An output beam 186 is then emitted from the opposite facet.

Embodiments that are optically pumped preferably comprise an undoped structure to reduce internal optical loss. Optically pumped laser structures may comprise a GaN or AlGaN bottom cladding layer, InGaN/GaN multiple quantum well active region layers sandwiched between InGaN or GaN waveguide layers, and an optional top cladding layer comprising AlGaN, GaN, AlInGaN or any combination thereof. The laser structure may also comprise one or more transparent layers made of other materials transparent at the desired wavelength. As an example and not a limitation, the one or more transparent layers may comprise oxide layers (e.g., $TiO_2$, $HfO_2$, $SiO_2$, $Al2O_3$), nitride layers such as $Si_xN_y$, or transparent conductive oxide (TCO) layers such as ITO or tin-oxide. Any combination of the oxide layer materials, nitride layer materials and TCO layer materials may be used in the one or more transparent layers.

The use of fully undoped laser structures for optical pumping seems to ideally fit the optical gain/loss balance requirements described above. First, the absence of doping in such structures allows for very low optical loss. Second, the crystal growth of undoped material is much easier, which allows using a lower growth temperature that preserves the green quantum well active region layer from thermal damage. Additionally, a dielectric material (for example titanium dioxide, which has a refractive index of approximately 2.5 in the green spectral region) may be used to maintain optical confinement in the optically pumped laser structure to define the pumping stripe. Third, the number of quantum wells may be increased with no limit because carrier transport issues are not present in optically pumped lasers, as is the case with electrically pumped lasers described below.

Laser structures described herein may also be electrically pumped. However, electrically pumped laser structures require the use of doping to form the p-n junction to electrically inject the active region layer. The use of doping may increase optical loss within the laser structure. Additionally, due to a short hole mean free path, the holes tend to populate the quantum well which is closest to the p-side of the structure while not injecting the other quantum wells. To resolve this issue, the laser structure may comprise thin, undoped quantum well barriers between the quantum wells (e.g., 2-6 nm) to let holes fly over and reach other remaining quantum wells. The use of undoped quantum well barriers may efficiently shift the p-n junction toward the other quantum wells and away from the first quantum well. Additionally, quantum well barriers comprising InGaN may be used with an average In concentration within the range of 3-10% to reduce quantum well barrier height.

It should now be understood that the embodiments described herein provide for GaN-based semiconductor laser devices comprising laser structures capable of lasing in the green spectral range with low threshold pumping power by utilizing increased numbers of quantum wells and lowering optical and output losses. The laser structures may be grown on c-plane or semipolar substrates and have a first cladding layer, one or more active region and waveguide layers, an optional second cladding layer, and optional dielectric layers. For semipolar orientations, a pumping stripe oriented along the [1-100] direction provides for higher gain at the low threshold pumping power. More than two quantum wells with spontaneous emission peak wavelength of greater than 520 nm at a reference pumping power density of about 1 kW/cm$^2$ may be used for both orientations. Optical loss may be minimized by reducing a concentration for Mg doping such that the net optical loss coefficient is less than 20 cm$^{-1}$. In an optically pumped laser structure, an undoped structure is preferred. To reduce output losses, both crystal orientations may have smooth, cleaved facets along the {1-100} crystallographic planes with high reflectivity coatings applied thereto. For electrically pumped lasers, the width of the quantum well barriers may be reduced (e.g., between about 2 nm and about 6 nm), InGaN-containing barriers with an average In concentration of about 3% to about 10% may be used, and the quantum well barriers may be undoped to enhance uniform injection for all of the quantum wells.

It is noted that recitations herein of a component of the present disclosure being "configured" in a particular way, to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component. It is also noted that some non-critical structural details of the laser source subassembly, e.g., lead lines, electrical connections, etc., have been omitted from the illustrations presented herewith to preserve clarity but will be readily apparent to those familiar with laser diode design and assembly.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present disclosure it is noted that the terms "about" and "approximately" are utilized herein to represent the inherent degree of uncertainty that may be attributed to any quantitative comparison, value, measurement, or other representation. The terms "about" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this teim is introduced in the claims as an open-ended transitional phrase that is used to introduce a recitation of a series of characteristics of the structure and should be interpreted in like manner as the more commonly used open-ended preamble term "comprising."

What is claimed is:

1. A semiconductor laser device operable to emit light having a desired wavelength in the green spectral range, the semiconductor laser device comprising a pumping source and a laser structure further comprising a substrate, a first cladding layer comprising one or more GaN layers, AlGaN layers, AlInGaN layers, or combinations thereof, and one or more active region layers comprising a plurality of InGaN quantum well layers and a plurality of quantum well barrier layers comprising GaN, InGaN or combinations thereof positioned between the InGaN quantum well layers, and at least two waveguide layers comprising one or more GaN layers or one or more InGaN layers, the InGaN layers having a lower concentration of In than the quantum well layers, with the one or more active layers positioned between the waveguide layers, wherein:

the first cladding layer is positioned on the substrate, and the one or more active region layers are positioned above the first cladding layer;

the one or more active region layers comprise a number of quantum wells having a spontaneous emission peak wavelength that is greater than about 520 nm at a reference pumping power density;

the laser structure further comprises a net optical loss coefficient of light propagating in a waveguide mode within the laser structure;

the pumping source is configured to pump each quantum well at a pumping power density such that a stimulated emission peak of each quantum well is within the green spectral range; and the number of quantum wells within the one or more active region layers are such that a net optical gain of the quantum wells is greater than the net optical loss coefficient of the semiconductor laser device at the desired wavelength in the green spectral range.

2. The semiconductor laser device of claim 1, wherein the one or more active region layers comprise three or more quantum wells.

3. The semiconductor laser device of claim 1, wherein the net optical loss coefficient is less than about 20 cm-1 and the laser structure further comprises high reflectivity coatings.

4. The semiconductor laser device of claim 3, wherein a surface plane of the substrate has a c-plane {0001} orientation.

5. The semiconductor laser device of claim 4, wherein the laser structure comprises a cleaved facet along the {1-100} crystallographic plane of the laser structure.

6. The semiconductor laser device of claim 3, wherein the pumping source comprises an optical pumping source operable to emit optical radiation into the pumping stripe to optically pump the laser structure such that the laser structure emits output radiation at the desired wavelength in the green spectral range.

7. The semiconductor laser device of claim 6, wherein the first cladding layer and the one or more active region layers comprise undoped material.

8. The semiconductor laser device of claim 6, wherein the optical pumping source comprises a semiconductor laser device.

9. The semiconductor laser device of claim 8, wherein:
semiconductor laser device further comprises an index guiding structure; and
the laser structure comprises a cavity length of less than about 0.5 mm.

10. The semiconductor laser device of claim 6, wherein:
the semiconductor laser device further comprises a pumping stripe oriented along the [1-100] direction of the laser structure and at least two cleaved facets; and
the one or more active region layers comprises three or more quantum wells.

11. The semiconductor laser device of claim 10, wherein a surface plane of the substrate has a semipolar {11-22} orientation.

12. The semiconductor laser device of claim 3, wherein the pumping source comprises an electrical pumping source comprising a p-n junction operable to inject current into the one or more active region layers through the pumping stripe.

13. The semiconductor laser device of claim 12, wherein the waveguide and cladding layers comprise a doping impurity of Mg at a concentration such that the net optical loss coefficient is less than about 20 cm$^{-1}$.

14. The semiconductor laser device of claim 12, wherein the one or more active region layers comprise three or more quantum wells.

15. The semiconductor laser device of claim 14, wherein:
the one or more active region layer comprises a plurality of InGaN quantum well layers and a plurality of InGaN quantum well barrier layers positioned between the InGaN quantum well layers; and
the quantum well barriers comprise an average In concentration of about 3% to about 10%.

16. The semiconductor laser device of claim 14, wherein the width of the InGaN quantum well barrier layers is less than 6 nm.

17. The semiconductor laser device of claim 12, wherein the laser structure further comprises a second cladding layer.

18. The semiconductor laser device of claim 3, wherein:
the laser structure further comprises one or more transparent layers transparent at the desired wavelength; and
the one or more transparent layers comprise one or more of the following: $TiO_2$, $HfO_2$, $SiO_2$, $Al2O_3$, $Si_xN_y$, ITO, tin-oxide, and combinations thereof.

19. The semiconductor laser of claim 1 wherein:
the substrate comprises a semipolar crystal orientation;
the laser structure further comprises a pumping stripe oriented along a highest differential gain direction of the laser structure; and
the laser structure further comprises a dry etch facet normal to the pumping stripe orientation.

20. The semiconductor laser claim 1 wherein:
the substrate comprises a semipolar crystal orientation;
the laser structure further comprises a pumping stripe oriented along a lowest differential gain direction of the laser structure; and
the laser structure further comprises a cleaved facet normal to the pumping stripe orientation.

21. The semiconductor laser device of claim 20, wherein:
the substrate comprises a semipolar {11-22} GaN substrate;
the cleaved facet is along the {1-100} crystallographic plane of the laser structure; and
the laser structure further comprises a pumping stripe oriented along the [1-100] direction of the laser structure.

22. The semiconductor laser device of claim 1, wherein the reference pumping power density is approximately 1 kW/cm$^2$.

23. A semiconductor laser device operable to emit light having a desired wavelength in the green spectral range, the semiconductor laser device comprising an optical pumping source and a laser structure further comprising a substrate, a first cladding layer, one or more active region layers, and at least two waveguide layers, wherein:
the first cladding layer is positioned on the substrate, and the one or more active region layers and the at least two waveguide layers are positioned on the first cladding layer such that the one or more active region layers are positioned between the two waveguide layers;
the laser structure comprises a cleaved facet along the {1-100} crystallographic plane of the laser structure and a pumping stripe along the [1-100] direction;
the cleaved facet comprises a high reflectivity coating;
the laser structure further comprises a net optical loss coefficient of light propagating in a waveguide mode defined by the active region, waveguide and cladding layers;
the one or more active region layers comprises three or more quantum wells such that a net optical gain of the quantum wells is greater than the net optical loss coefficient of the semiconductor laser device at the desired wavelength in the green spectral range; and
the optical pumping source is operable to emit optical radiation into the pumping stripe to optically pump each quantum well at a pumping power density such that a stimulated emission of each quantum well is within the green spectral range.

* * * * *